(12) United States Patent
Uemura et al.

(10) Patent No.: US 12,073,912 B2
(45) Date of Patent: Aug. 27, 2024

(54) APPARATUSES AND METHODS FOR COMMAND DECODING WITH SERIES CONNECTED LATCHES

(71) Applicant: MICRON TECHNOLOGY, INC., Boise, ID (US)

(72) Inventors: Yutaka Uemura, Tokyo (JP); Yoshiya Komatsu, Kanagawa (JP)

(73) Assignee: MICRON TECHNOLOGY, INC., Boise, ID (US)

( * ) Notice: Subject to any disclaimer, the term of this patent is extended or adjusted under 35 U.S.C. 154(b) by 150 days.

(21) Appl. No.: 17/752,605

(22) Filed: May 24, 2022

(65) Prior Publication Data

US 2023/0386530 A1 Nov. 30, 2023

(51) Int. Cl.
G11C 7/10 (2006.01)
H03K 19/173 (2006.01)
H03K 19/20 (2006.01)

(52) U.S. Cl.
CPC .......... *G11C 7/1039* (2013.01); *G11C 7/1063* (2013.01); *G11C 7/109* (2013.01); *H03K 19/1737* (2013.01); *H03K 19/20* (2013.01)

(58) Field of Classification Search
CPC ..... G11C 7/1039; G11C 7/1063; G11C 7/109; G11C 7/22; G11C 7/222; G11C 8/12; H03K 19/1737; H03K 19/20
See application file for complete search history.

(56) References Cited

U.S. PATENT DOCUMENTS

| 2009/0102531 A1* | 4/2009 | Nanba | G01R 31/31723 327/202 |
| 2015/0155023 A1 | 6/2015 | Lee et al. | |
| 2023/0386529 A1 | 11/2023 | Uemura et al. | |

OTHER PUBLICATIONS

U.S. Appl. No. 17/752,573 titled "Apparatuses and Methods for Command Decoding" filed May 24, 2022, pp. all pages of application as filed.

* cited by examiner

*Primary Examiner* — Sultana Begum
(74) *Attorney, Agent, or Firm* — Dorsey & Whitney LLP

(57) ABSTRACT

In some examples, command decoders may have multiple command paths. In some examples, command signals from one command path may be provided to another command path from a node located between two latches of the command decoder, such as two latches of a flip-flop. In some examples, the command decoder may include separate flip-flops for different command modes. In some examples, the separate flip-flops may be tristate flip-flops. In some examples, the command decoder may include alternate logic circuits rather than a multiplexer.

20 Claims, 11 Drawing Sheets

APPARATUSES AND METHODS FOR COMMAND DECODING WITH SERIES CONNECTED LATCHES

BACKGROUND

Semiconductor memories are used in many electronic systems to store data that may be retrieved at a later time. Semiconductor memories are generally controlled by providing the memories with command signals, address signals, and clock signals. The various signals may be provided by a memory controller, for example. The command signals may control the semiconductor memories to perform various memory operations, for example, a read operation to retrieve data from a memory, and a write operation to store data to the memory. The address signals may indicate the location in the memory the operation indicated by the command should be performed. The clock signals may be used to control the timing of the command and address signals as well as control the timing of the execution of the commands. For example, commands and/or write data may be latched by the memory on rising and/or falling edges of the clock signal. Read data may be output by the memory on rising and/or falling edges of the clock signal. Using the clock signal to provision the timing of commands and data may help ensure proper operation of the memory and receipt of valid outputs by an external device, such as the memory controller.

As the frequency of clock signals increase to accommodate faster memory operations, propagation delays throughout the memory, such as in the command path, may limit the operation speed of the memory. Accordingly, techniques for reducing propagation delays are desired.

DETAILED DESCRIPTION

Command decoders as disclosed herein may have reduced propagation delays and/or provide additional command set-up time compared to existing command decoders. In some embodiments, the command decoder many provide command signals from one command path to another command path sooner (e.g., one or one half clock cycle sooner) compared to existing command decoders. In some embodiments, the command signals may be provided from one command path to another command path from a node located between two latches of the command decoder, such as two latches of a flip-flop. In some embodiments, the command decoder may include separate flip-flops for different command modes (e.g., 1N and 2N mode). In some embodiments, the separate flip-flops may be tristate flip-flops (e.g., they may be put in a high impedance state). In some embodiments, the command decoder may include alternate logic circuits rather than a multiplexer. The various embodiments may be combined.

Figure 1:
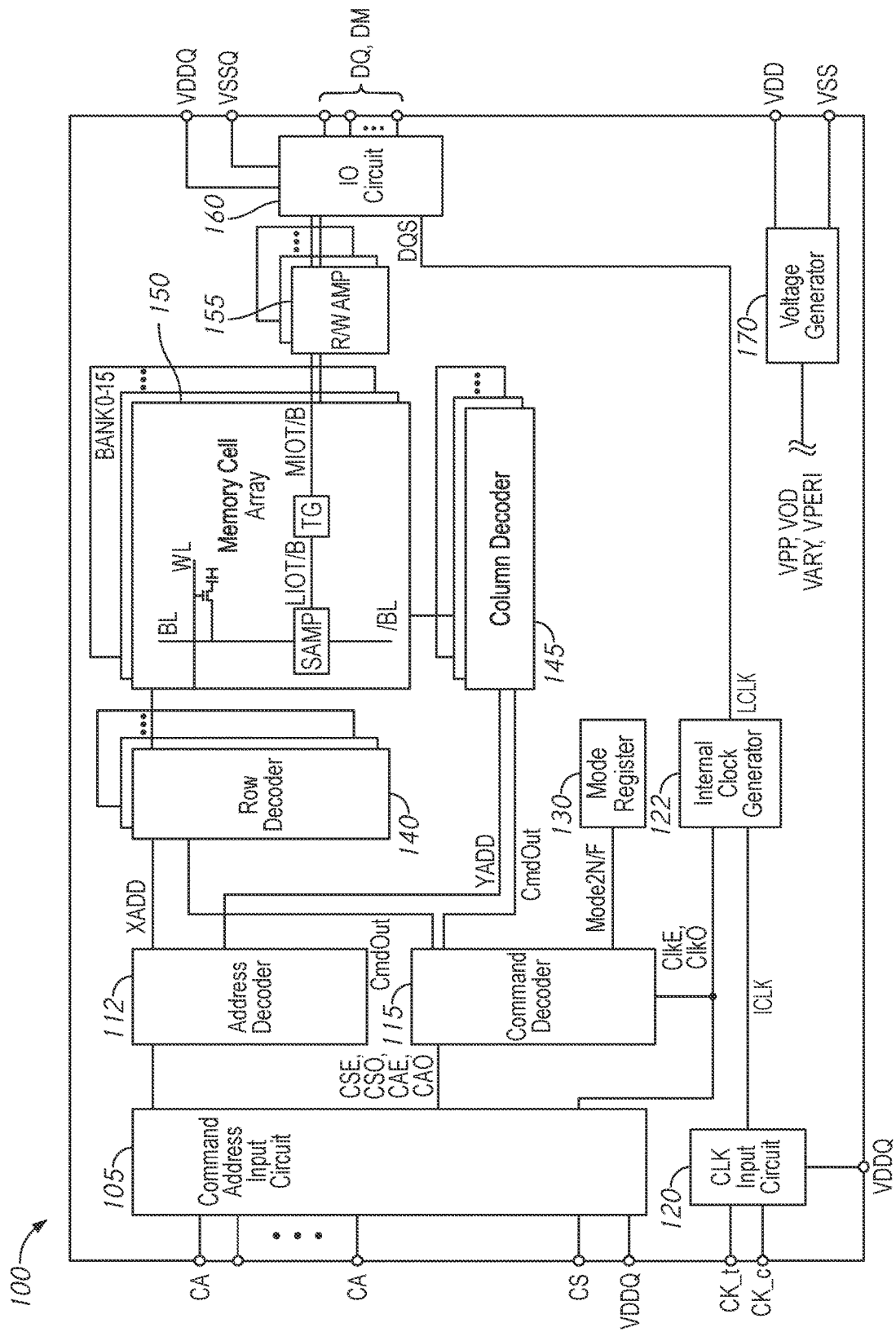
FIG. 1 is a block diagram of an apparatus according to at least one embodiment of the disclosure.

FIG. 1 is a block diagram of an apparatus according to at least one embodiment of the disclosure. The apparatus may be a semiconductor device 100, and will be referred to as such. The semiconductor device 100 may include, without limitation, a DRAM device. The semiconductor device 100 may be integrated into a single semiconductor chip in some embodiments of the disclosure.

The semiconductor device 100 includes a memory array 150. The memory array 150 is shown as including a plurality of memory banks. In the embodiment of FIG. 1, the memory array 150 is shown as including sixteen memory banks BANK0-BANK15, however memory array 150 may have more or fewer memory banks in other examples (e.g., 4, 8, 32). Each memory bank includes a plurality of word lines WL, a plurality of bit lines BL and /BL, and a plurality of memory cells MC arranged at intersections of the plurality of word lines WL and the plurality of bit lines BL and /BL. Selection of the word line WL is performed by a row decoder 140 and selection of the bit lines BL and /BL is performed by a column decoder 145. In the embodiment of FIG. 1, the row decoder 140 includes a respective row decoder for each memory bank and the column decoder 145 includes a respective column decoder for each memory bank. The bit lines BL and /BL (e.g., digit lines) are coupled to a respective sense amplifier (SAMP). Read data from the bit line BL or /BL is amplified by the sense amplifier SAMP, and transferred to read/write amplifiers 155 over complementary local data lines (LIOT/B), transfer gate (TG), and complementary main data lines (MIOT/B). Conversely, write data outputted from the read/write amplifiers 155 is transferred to the sense amplifier SAMP over the complementary main data lines MIOT/B, the transfer gate TG, and the complementary local data lines LIOT/B, and written in the memory cell MC coupled to the bit line BL or /BL.

The semiconductor device 100 may employ a plurality of external terminals that include command and address (CA) and chip select (CS) terminals coupled to a command and address bus to receive commands and addresses, and a CS signal. The external terminals may further include clock terminals to receive clocks CK_t and CK_c, data terminals DQ, data mask terminal DM, and power supply terminals to receive power supply potentials VDD, VSS, VDDQ, and VSSQ.

The clock terminals are supplied with external clocks CK_t and CK_c that are provided to an input buffer 120. The external clocks may be complementary. Clock signals are complementary when a rising edge of a first clock signal occurs at the same time as a falling edge of a second clock signal, and when a rising edge of the second clock signal occurs at the same time as a falling edge of the first clock signal. The input buffer 120 generates an internal clock ICLK based on the CK_t and CK_c clocks. The ICLK clock is provided to the command decoder 115 and to an internal clock generator 122. The internal clock generator 122 provides various internal clocks LCLK based on the ICLK clock. The LCLK clocks may be used for timing operation of various internal circuits. For example, LCLK may provide a DQS clock signal. The DQS clock may be provided to the input/output circuit 160 to time operation of circuits included in the input/output circuit 160 to time the provision of read data from the memory array 150 in some embodiments.

In some embodiments, the internal clock generator 122 may provide internal command clock signals ClkE and ClkO to the command address input circuit 105 and/or command decoder 115. Command clock signals ClkE and ClkO may be complementary. In some embodiments, the frequency of ClkE and ClkO may be half the frequency of the external clocks CK_t and CK_c. As described herein, the ClkE and ClkO signals may be used to provision command signals to and from the command decoder 115 and/or along command paths of the command decoder 115. In some embodiments, ClkE may be used to provision command signals along one command path and ClkO may be used to provision command signals along another command path.

The CA terminals may be supplied with memory addresses. The memory addresses supplied to the CA terminals are transferred, via a command address input circuit 105, to an address decoder 112. The address decoder 112 receives the address and supplies a decoded row address XADD to the row decoder 140 and supplies a decoded column address YADD to the column decoder 145. The CA terminals may be supplied with commands. Examples of commands include access commands for accessing the memory, such as read commands for performing read operations and write commands for performing write operations, mode register write and read commands for performing mode register write and read operations, as well as other commands and operations.

The commands may be provided as internal command signals to a command decoder 115 via the command address input circuit 105. The command address input circuit 105 may provide internal command signals CAE, CAO, as well as internal chip select signals CSE, CSO. In some embodiments, command signals CAE and chip select signals CSE may be provided to one command path of the command decoder 115 and command signals CAO and chip select signals CSO may be provided to another command path. The command decoder 115 includes circuits to decode the internal command signals to generate various internal signals and commands for performing operations, collectively command signals CmdOut. For example, the command decoder 115 may provide a row activation command to select a word line and a read or write command to select a bit line. While the command decoder 115 is shown in FIG. 1 providing commands to the row decoder 140 and column decoder 145, in other examples, the command decoder 115 may provide commands to additional and/or different components of the device 100.

When an activate command and a row address are received, followed by a read command and a column address, read data is read from memory cells in the memory array 150 corresponding to the row address and column address. The read command is received by the command decoder 115, which provides internal commands so that read data from the memory array 150 is provided to the read/write amplifiers 155. The read data is provided to the input/output circuit 160 and output to the data terminals DQ. When an activate command and a row address are received, followed by a write command and a column address, write data supplied to the data terminals DQ is written to a memory cells in the memory array 150 corresponding to the row address and column address. A data mask may be provided to the data mask terminals DM to mask portions of the data when written to memory. The write command is received by the command decoder 115, which provides internal commands so that the write data is received by input receivers in the input/output circuit 160. The write data is supplied from the data terminals DQ via the input/output circuit 160 to the read/write amplifiers 155, and by the read/write amplifiers 155 to the memory array 150 to be written into the memory cell MC. Read and write may be provided to the DQ terminals connection with one or more clock signals, such as the DQS signal during read operations.

The command decoder 115 may access mode register 130 that is programmed with information for setting various modes and features of operation for the semiconductor device 100. In some embodiments, mode register 130 may include multiple registers. For example, the mode register 130 may be programmed with information related to data access latency, such as read latency or write latency. As another example, the mode register 130 may be programmed with information related to whether 1N mode or 2N mode is being used for commands. In 1N mode, the rising edges of both ClkE and ClkO clock signals are used by the command decoder 115 for provisioning command signals. In 2N mode, the rising edges of ClkE or ClkO are used by the command decoder 115 for provisioning command signals. In some embodiments, the mode register 130 may provide a control signal mode2N and/or inverted signal mode2NF indicating whether the semiconductor device 100 including command decoder 115 and address decoder 112 is operating in 1N mode or 2N mode. However, in other examples, other techniques may be used to program settings or selecting modes of operation of the semiconductor device 100.

The information in the mode register 130 may be programmed by providing the semiconductor device 100 a mode register write command or a multi-purpose command, which causes the semiconductor device 100 to perform a mode register write operation. In some embodiments, data to be written to the mode register 130 is provided via the CA terminals and/or the DQ terminals. The command decoder 115 accesses the mode register 130, and based on the programmed information along with the internal command signals provides the internal signals to control the circuits of the semiconductor device 100 accordingly. Information programmed in the mode register 130 may be externally provided by the semiconductor device 100 using a mode register read command, which causes the semiconductor device 100 to access the mode register 130 and provide the programmed information (e.g., to a memory controller, not shown). In some embodiments, the information may be provided via the C/A terminals and/or the DQ terminals.

The power supply terminals are supplied with power supply potentials VDD and VSS. The power supply potentials VDD and VSS are supplied to an internal voltage generator circuit 170. The internal voltage generator circuit 170 generates various internal potentials VPP, VOD, VARY, VPERI, and the like based on the power supply potentials VDD and VSS supplied to the power supply terminals. The internal potential VPP is mainly used in the row decoder 140, the internal potentials VOD and VARY are mainly used in the sense amplifiers SAMP included in the memory array 150, and the internal potential VPERI is used in many peripheral circuit blocks.

The power supply terminals are also supplied with power supply potentials VDDQ and VSSQ. The power supply potentials VDDQ and VSSQ are supplied to the input/output circuit 160. In some embodiments, VDDQ may be supplied to clock input buffer circuit 120 and/or command/address input circuit 105. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 160 so that power supply noise generated by the input/output circuit 160 does not propagate to the other circuit blocks.

Returning to the command decoder 115, as noted, the command decoder 115 may receive the command clock signals ClkE, ClkO. The command decoder 115 may use the ClkE, ClkO to time the receipt (e.g., latching) of signals CAE, CAO, CSE, and/or CSO, and time providing of the commands CmdOut. The command clock signals ClkE, ClkO may ensure valid command signals are latched from the command address input circuit 105, decoded properly, and/or the command CmdOut is provided by the command decoder 115 at a time that allows other components of the semiconductor device 100 to latch a valid command as well at a time that allows the operation indicated by the command CmdOut to be executed at a proper time. For example, if command CmdOut is provided too early or too late, it may not be properly latched by other components, and the operation indicated by the command may not be completed. In another example, if the command CmdOut is provided too early or too late, the operation may not be executed at a proper time, and the operation may interfere with other operations and/or the semiconductor device 100 may provide outputs (e.g., data at DQ) at an unexpected time. This may cause an external device, such as a memory controller (not shown), to receive invalid outputs. Accordingly, proper timing of the command paths of the command decoder 115 may allow for the proper operation of semiconductor device 100.

Figure 2:
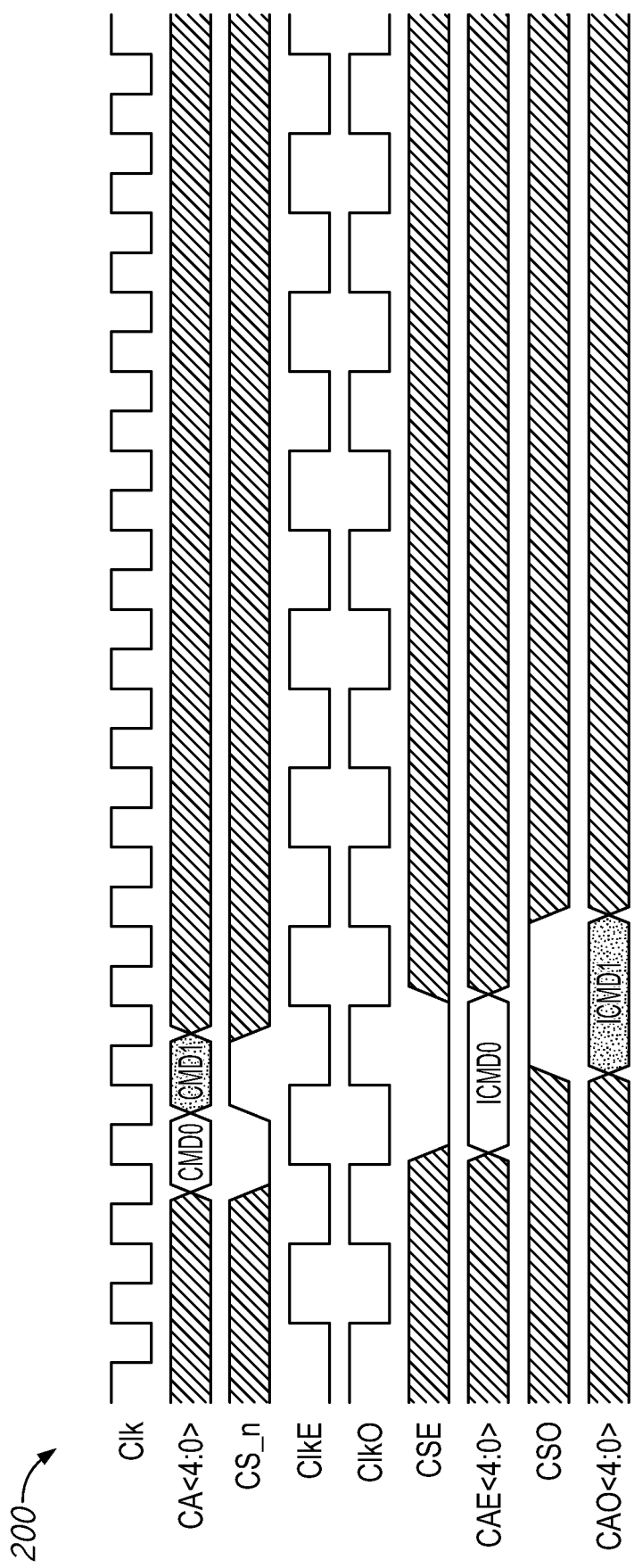
FIG. 2 is a timing diagram illustrating provision of two-cycle commands in a memory according to at least one embodiment of the disclosure.

FIG. 2 is a timing diagram illustrating provision of two-cycle commands in a memory according to at least one embodiment of the disclosure. The timing diagram 200 illustrates the state of various signals provided to a memory, such as the memory included with semiconductor device 100. The top row illustrates an external clock signal Clk which may be provided to the memory by a memory controller or other external device. The clock signal Clk may correspond to CK_t or CK_c shown in FIG. 1. While the complement of Clk may also be provided to the memory, for purposes of illustration, it is not shown in FIG. 2.

CA<4:0> may correspond to command signals provided to the memory, such as via a command bus to CA terminals. CS_n may correspond to the chip select signal provided to the memory, such as via CS terminal. Both the CA<4:0> and CS_n signals may be provided by a memory controller or other external device. In some embodiments, the state of the CS_n signal may determine whether the memory responds to the command signals CA<4:0>.

In the example shown in FIG. 2, a two-cycle command is indicated by CMD0 and CMD1, where CMD0 is a first portion of the command and CMD1 is a second portion of the command. The portions CMD0 and CMD1 are provided sequentially on the command bus to the memory. Each command portion is provided over a single clock cycle of the Clk signal. Similarly, the CS_n signals are provided for one clock cycle. In some embodiments, this may occur when the memory is operating in a 1N mode.

The Clk signal may be received by a clock input buffer circuit, such as clock input buffer circuit 120 and used by an internal clock generator, such as internal clock generator 122 to generate command clock signals ClkE and ClkO. In some embodiments, such as the one shown in FIG. 2, ClkE and ClkO are complementary and are half the frequency of the Clk signal. In some embodiments, the internal clock generator may include a clock divider and/or other circuitry to generate the command clock signals.

The CA<4:0>, and CS_n signals may be used by a command address input circuit of the memory, such as command address input circuit 105, to generate internal command signals. Based at least in part, on the Clk, ClkE, and/or ClkO signals, the command address input circuit may generate internal command signals CAE<4:0> and CAO<4:0>. The signals on CAE<4:0> and CAO<4:0> may correspond to signals provided to different command paths of a command decoder, such as command decoder 115. In some embodiments, command signal ICMD0 on CAE<4:0> may correspond to command portion CMD0 and the command signal ICMD1 on CAE<4:0> may correspond to command portion CMD1. In contrast to the two-cycle commands CMD0 and CMD1, the internal command signals ICMD0 and ICMD1 are provided for two clock cycles of the Clk signal (one cycle for the ClkE and ClkO signals).

Similarly, based at least in part, on the Clk, ClkE, and/or ClkO signals, the command address input circuit may generate internal chip select signals CSE and CSO that may be provided to different command paths of the command decoder. In contrast to the CS_n signal, the internal chip select signals may be provided for two clock cycles of the Clk signal rather than one clock cycle.

Figure 3:
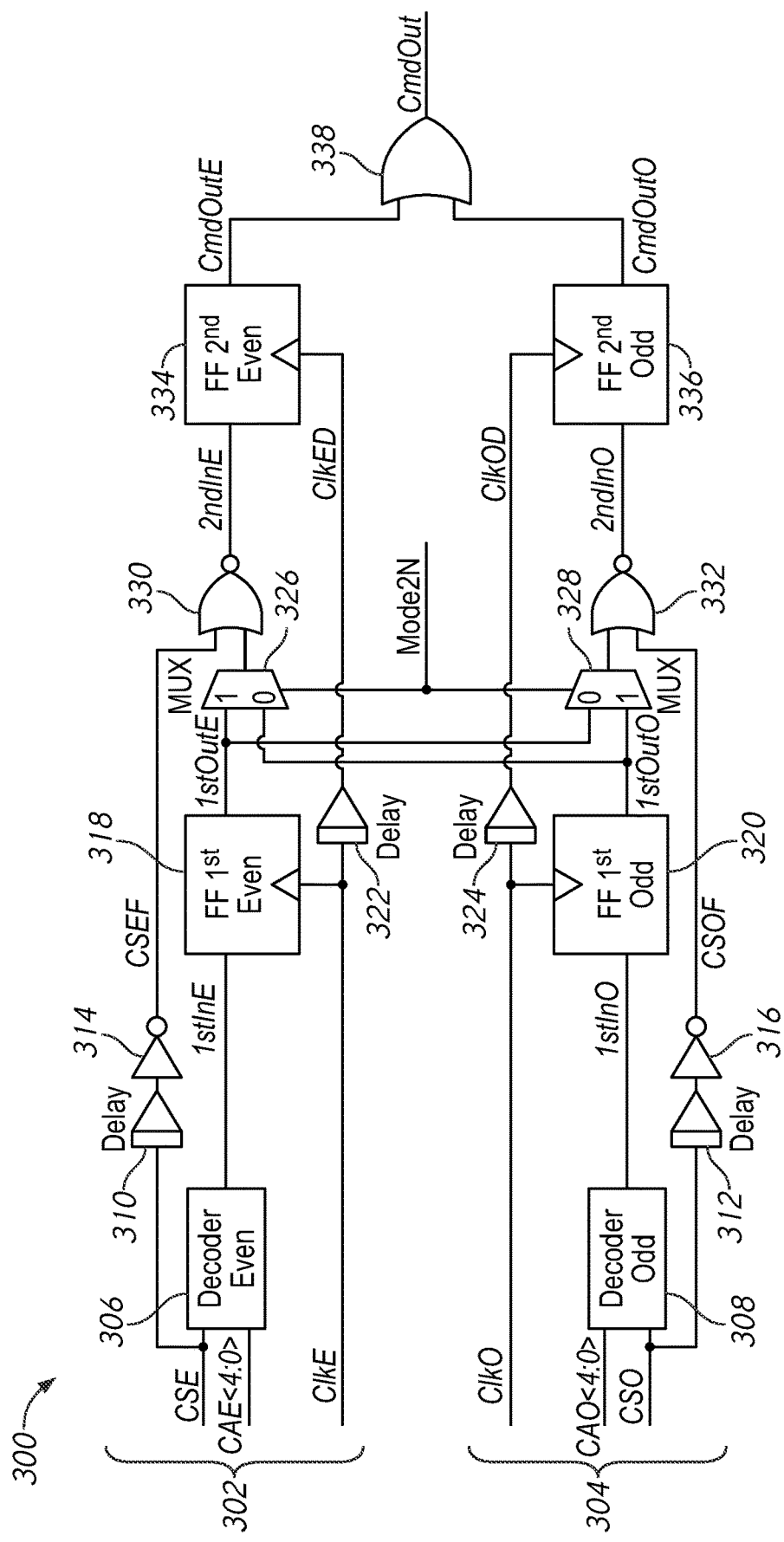
FIG. 3 is a block diagram of a command decoder circuit.

FIG. 3 is a block diagram of a command decoder circuit. The command decoder circuit 300 has two command paths: even 302 and odd 304. The even command path 302 receives internal chip select signal CSE and internal command signals CAE<4:0> from a command address input circuit. The even command path 302 further receives command clock signal ClkE from an internal clock signal generator. The odd command path 304 receives internal chip select signal CSO and internal command signals CAO<4:0> from the command address input circuit. The odd command path 304 further receives command clock signal ClkO from an internal clock signal generator.

A decoder 306 of the even command path 302 receives the command clock CSE and CAE<4:0> signals and provides a signal 1stInE to a flip-flop 318. The flip-flop 318 receives the ClkE signal and latches the 1stInE signal responsive to an edge of the ClkE signal. The flip-flop 318 provides signal 1stOutE to a "1" input of a multiplexer (mux) 326 of the even command path 302 and a "0" input of mux 328 of the odd command path 304.

Turning to the odd command path 304, a decoder 308 receives the command clock CSO and CAO<4:0> signals and provides signal 1stInO to a flip-flop 320. The flip-flop 320 receives the ClkO signal and latches the 1stInO signal responsive to an edge of the ClkO signal. The flip-flop 320 provides signal 1stOutO to a "0" input of mux 326 of the even command path 302 and a "1" input of mux 328 of the odd command path 304.

Mux 326 and 328 receive a control signal mode2N, which may be provided by a mode register in some applications. The state of the mode2N signal may indicate whether the memory that includes command decoder 300 is operating in 1N mode or 2N mode. When the mode2N signal is in a low logic state ("0"), the memory operates in 1N mode, and commands are received over a single cycle of the external clock Clk as shown in FIG. 2. The muxes 326, 328 may be clocked inverters. Responsive to the low logic state of the mode2N signal, mux 326 provides inverted signal 1stOutO and mux 328 provides inverted signal 1stOutE.

Returning to the even command path 302, a delay 310 and an inverter 314 receive the CSE signal and output an inverted CSE signal, CSEF. A NOR logic circuit 330 receives the CSEF signal and the output of the mux 326 (which is inverted 1stOutO when mode2N=0) and provide signal 2ndInE. Similarly in the odd command path 304, a delay 312 and inverter 316 receive the CSO signal and provide an inverted CSO signal, CSOF. A NOR logic circuit 332 receives the CSOF signal and the output of mux 328 (which is inverted 1stOutE when mode2N=0) and provides signal 2ndInO.

A flip-flop 334 of the even command path 302 receives the 2ndInE signal and latches it based on an edge of a delayed ClkE signal, ClkED, which is delayed by delay 322 and provides a signal CmdOutE. A flip-flop 336 of the odd command path 304 receives the 2ndInO signal and latches it based on an edge of a delayed ClkO signal, ClkOD, which is delayed by delay 324 and provides a signal CmdOutO. The CmdOutE and CmdOutO are provided to an OR logic circuit 338 to provide a command signal CmdOut.

Figure 4:
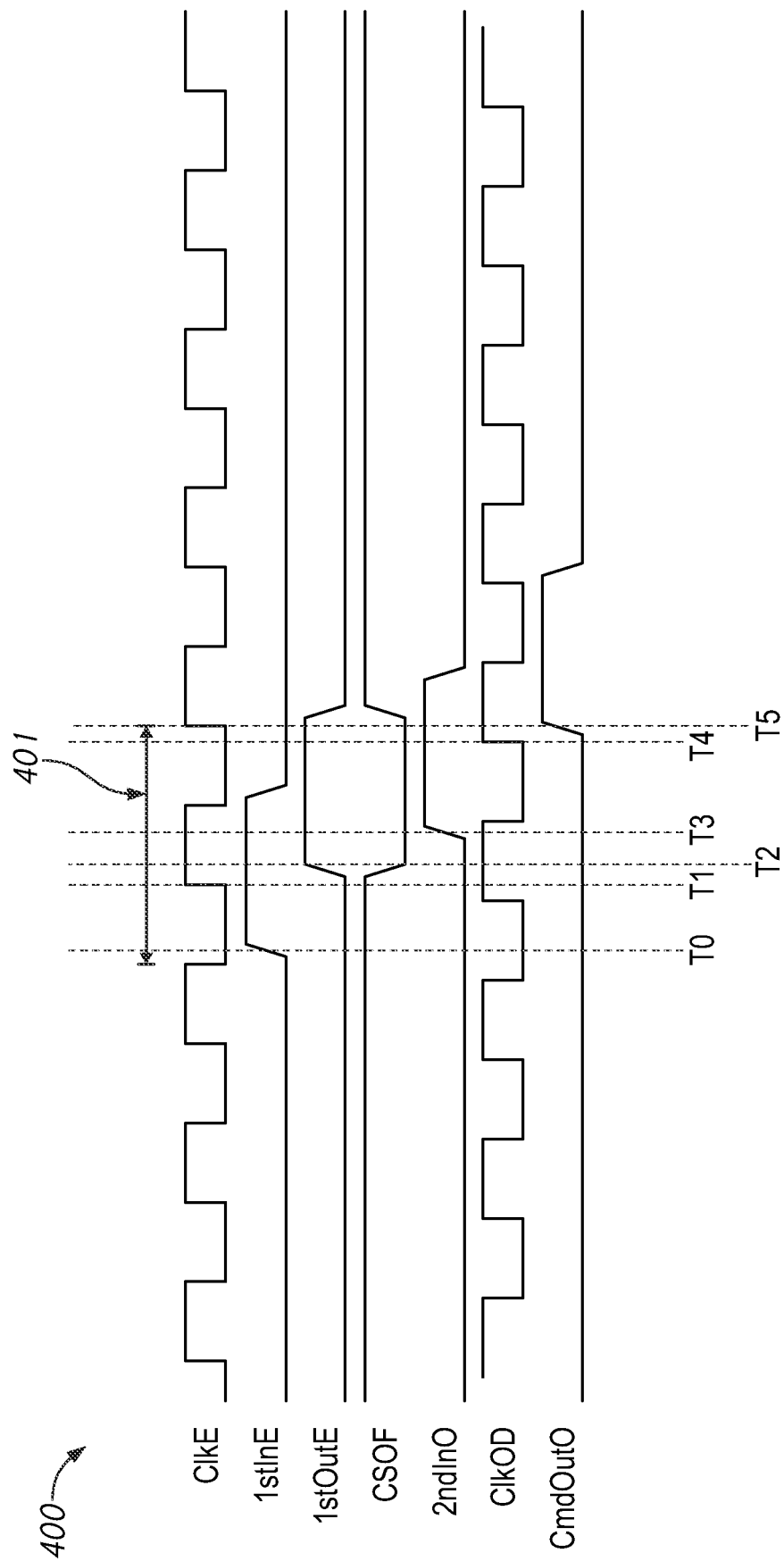
FIG. 4 is a timing diagram illustrating the states of various signals of the command decoder circuit shown in FIG. 3.

FIG. 4 is a timing diagram illustrating the states of various signals of the command decoder circuit shown in FIG. 3. The signals shown in timing diagram 400 follow command signals provided to the even command path 302 and provided to the odd command path to an input of mux 328.

At or around time T0, the decoder 306 provides a high (e.g., '1,' active) 1stInE signal to the flip-flop 318. Responsive to the rising edge of ClkE at or around time T1, the flip-flop 318 latches the 1stInE signal. Beginning at or around time T2, the flip-flop 318 provides a high 1stOutE signal to the mux 328. The mux 328 provides an inverted (e.g., low, '0,') 1stOutE signal (not shown) to NOR logic circuit 332.

The inverter 316 provides the CSOF signal to the NOR logic circuit 332, which provides the 2ndInO signal. The 2ndInO signal is high when 1stOutE is high and CSOF is low because the mux 328 inverts the 1stOutE signal provided to the NOR logic circuit 332. At or around time T2, the CSOF transitions from high to low. The NOR logic circuit 332 provides a high 2ndInO signal to the flip-flop 336 at or around time T3 responsive to the inverted 1stOutE signal (which is low) and the low CSOF signal.

Responsive to the rising edge of the delayed ClkOD at or around time T4, flip-flop 336 latches the 2ndInO signal and begins proving a high command signal CmdOutO at or around time T5. Although not shown in timing diagram 400, command signals provided to the odd command path 304 and provided to the even command path 302 to mux 326 would follow a similar timing.

Both the even and odd command paths 302 and 304 have propagation delays, for example, at flip-flops 318, 320 and muxes 326 and 328. If flip-flops 334 and 336 latch the 2ndInE and 2ndInO signals, respectively, too soon, the flip-flops may latch the signals before the NOR logic circuits have provided valid outputs. This may cause invalid commands to be provided by the command decoder 300. To alleviate this, delays 322, 324 are provided to delay latching by flip-flops 334 and 336, respectively. However, delaying the latching of flip-flops 334 and 336 delays output of the internal command signal CmdOut. This reduces the command set-up time available for the memory.

According to embodiments of the present disclosure, a command decoder may provide signals from one command path to another command path earlier (e.g., providing signals from the even command path to the odd command path or vice versa) in 1N mode. In some embodiments, the signals may be provided from an intermediate node in one of the flip-flops. For example, from a node between latches of the flip-flop. The signal may be provided directly to the other command path and/or via one or more logic circuits.

Figure 5:
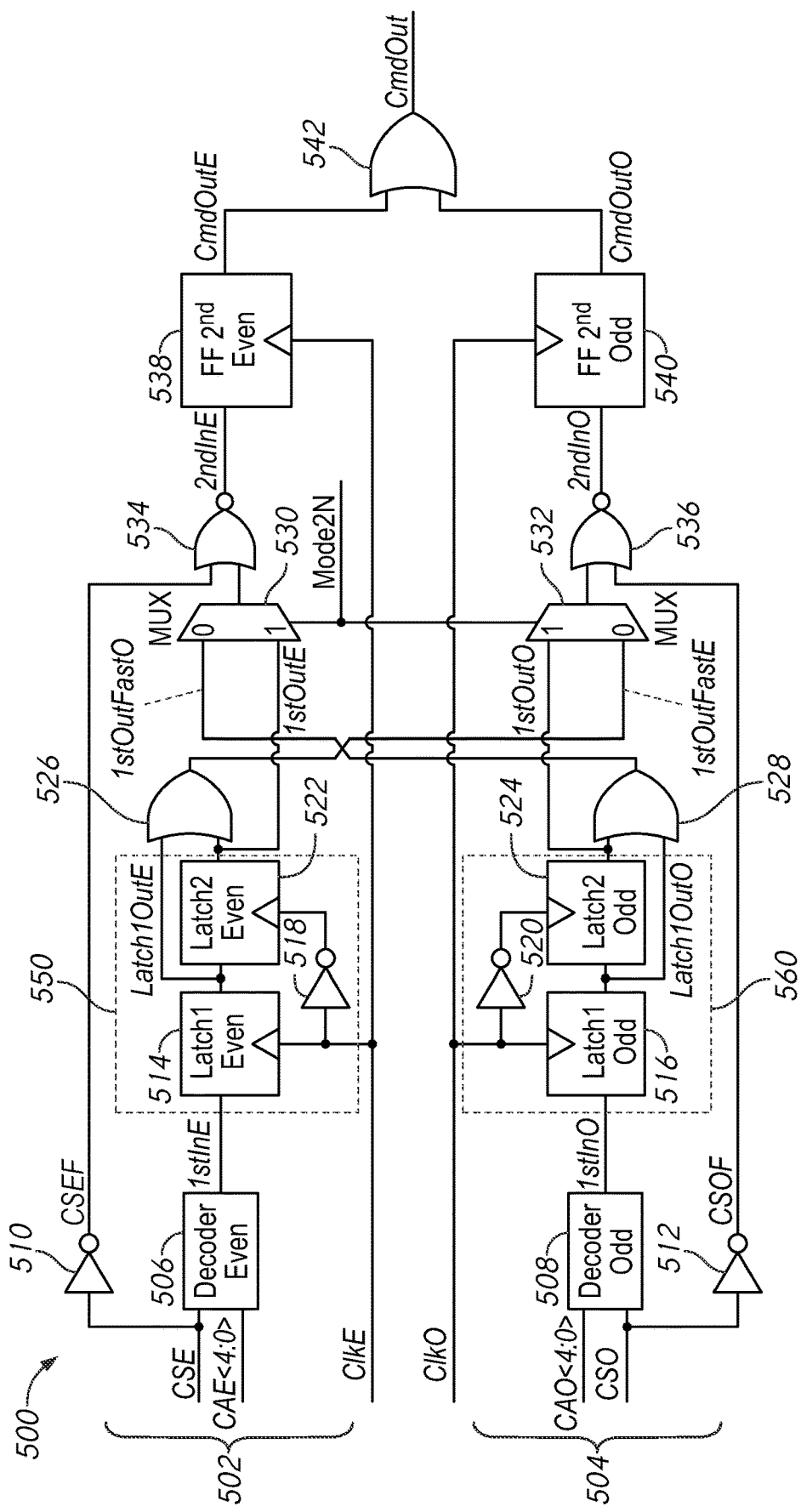
FIG. 5 is a command decoder circuit according to at least one embodiment of the disclosure.

FIG. 5 is a command decoder circuit according to at least one embodiment of the disclosure. In some embodiments, the command decoder 500 may be used to implement or may be included in command decoder 115. The command decoder circuit 500 has two command paths: even 502 and odd 504. The even command path 502 receives internal chip select signal CSE and internal command signals CAE<4:0> from a command address input circuit, such as command address input circuit 105. The even command path 502 further receives command clock signal ClkE from an internal clock signal generator, such as internal clock signal generator 122. The odd command path 504 receives internal chip select signal CSO and internal command signals CAO<4:0> from the command address input circuit. The odd command path 504 further receives command clock signal ClkO from the internal clock signal generator.

A decoder 506 of the even command path 502 receives the command clock CSE and CAE<4:0> signals and provides signal 1stInE to a flip-flop 550. The flip-flop 550 may include a latch 514 that receives the ClkE signal, an inverter 518 that receives the ClkE signal, and a latch 522 that receives the output of the latch 514 and an inverted ClkE signal from the inverter 518. The flip-flop 550 latches the 1stInE signal with latch 514 responsive to an edge of the ClkE signal and latch 522 may latch the output of latch 514 responsive to a different edge of the ClkE signal due to receiving the inverted ClkE signal from inverter 518. By "different edge" it is meant for example, if latch 514 is triggered by a rising edge, latch 522 is triggered by a falling edge, and vice versa.

Although not shown in FIG. 3, the flip-flop 318 may also include two latches and an inverter in a similar arrangement as shown in flip-flop 550. However, unlike the flip-flop 318, the flip-flop 550 provides two outputs: signal Latch1OutE provided by latch 514 and signal 1stOutE provided by latch 522. Signals Latch1OutE and 1stOutE may be provided to an OR logic circuit 526. The OR logic circuit 526 may provide a signal 1stOutFastE to a "0" input of a mux 532 of the odd command path 504. The signal 1stOutE may further be provided to a "1" input of a mux 530 of the even command path 502.

Turning to the odd command path 504, a decoder 508 receives the command clock CSO and CAO<4:0> signals and provides signal 1stInO to a flip-flop 360. The flip-flop 560 may include a latch 516 that receives the ClkO signal, an inverter 520 that receives the ClkO signal, and a latch 524 that receives the output of the latch 516 and an inverted ClkO signal from the inverter 520. The flip-flop 550 latches the 1stInO signal with latch 516 responsive to an edge of the ClkO signal and latch 524 may latch the output of latch 516 responsive to a different edge of the ClkO signal due to receiving the inverted ClkO signal from inverter 520.

Although not shown in FIG. 3, the flip-flop 320 may also include two latches and an inverter in a similar arrangement as shown in flip-flop 560. However, unlike the flip-flop 320, the flip-flop 560 provides two outputs: signal Latch1OutO provided by latch 516 and signal 1stOutO provided by latch 524. Signals Latch1OutO and 1stOutO may be provided to an OR logic circuit 528. The OR logic circuit 528 may provide a signal 1stOutFastO to a "0" input of a mux 530 of the even command path 502. The signal 1stOutO may further be provided to a "1" input of a mux 532 of the odd command path 504.

Mux 530 and 532 receive a control signal mode2N, which may be provided by a mode register in some applications, such as mode register 130. The state of the mode2N signal may indicate whether the memory that includes command decoder 500 is operating in 1N mode or 2N mode. When the mode2N signal is in a low logic state ("0"), the memory operates in 1N mode, and commands are received over a single cycle of the external clock Clk as shown in FIG. 2. The muxes 530, 532 may be clocked inverters. Responsive to the low logic state of the mode2N signal, mux 530 provides inverted signal 1stOutFastO and mux 532 provides inverted signal 1stOutFastE.

Returning to the even command path 502, an inverter 510 receives the CSE signal and provides an inverted CSE signal, CSEF. A NOR logic circuit 534 receives the CSEF signal and the output of the mux 530 (which is inverted 1stOutFastO when mode2N=0) and output signal 2ndInE. Similarly in the odd command path 504, an inverter 512 receive the CSO signal and outputs an inverted CSO signal, CSOF. A NOR logic circuit 536 receives the CSOF signal and the output of mux 532 (which is inverted 1stOutFastE when mode2N=0) and provides signal 2ndInO.

A flip-flop 538 of the even command path 502 receives the 2ndInE signal and latches it based on an edge of the ClkE signal and provides signal CmdOutE. A flip-flop 540 of the odd command path 504 receives the 2ndInO signal and latches it based on an edge of the ClkO signal and provides a signal CmdOutO. The CmdOutE and CmdOutO are provided to an OR logic circuit 542 to provide an internal command signal CmdOut.

Because the signal latched from the decoders 506, 508 are provided after latches 514 and 516 of flip-flops 550 and 560, rather than latches 522 and 524, respectively, the signals are transferred between the even and odd command paths 502, 504 sooner (e.g., one-half clock cycle sooner, one clock cycle sooner). In some embodiments, this may reduce the risk of the flip-flops 538 and 540 latching signals too early, and thus latching invalid command data. This may allow one or more delay circuits, such as delays 310, 312, 322, and 324 to be omitted. In some embodiments, the command decoder 500 may allow the flip flops 538 and 540 to latch signals earlier, which may allow CmdOut to be provided by the command decoder 500 earlier. This in turn may increase a setup time for the command.

Figure 6:
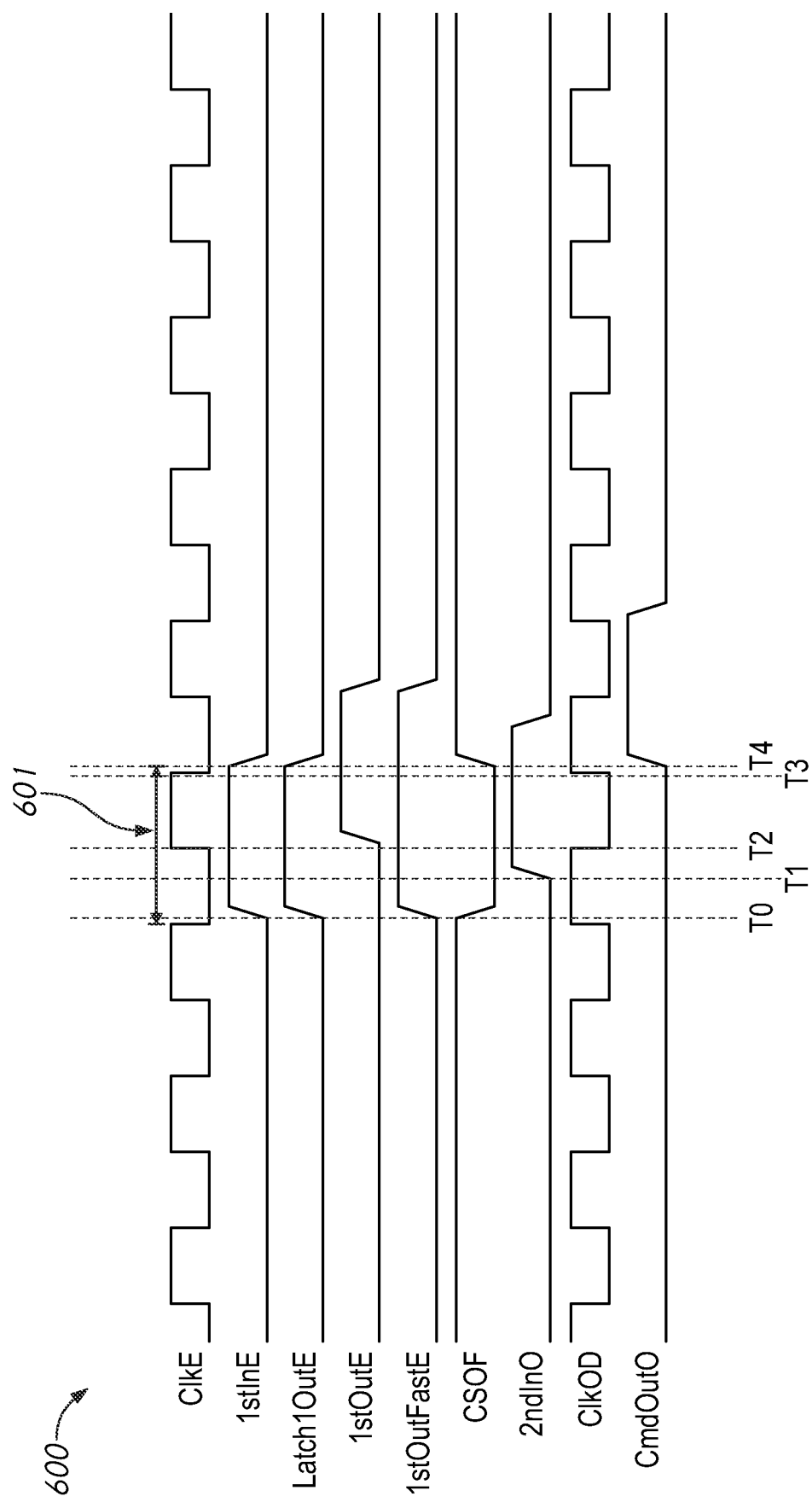
FIG. 6 is a timing diagram illustrating the states of various signals of the command decoder circuit shown in FIG. 5.

FIG. 6 is a timing diagram illustrating the states of various signals of the command decoder circuit shown in FIG. 5. The signals shown in timing diagram 600 follow command signals provided to the even command path 502 and provided to the odd command path 504 to an input of mux 532.

At or around time T0, the decoder 506 provides a high 1stInE signal to the flip-flop 550. Responsive, at least in part, to the falling clock edge of ClkE at or around time T0, the latch 514 of flip-flop 550 may pass through the 1stInE signal and provides a high Latch1OutE signal. When ClkE goes high, the latch 514 may latch an input to the latch 514 responsive to the rising edge of ClkE. While ClkE is low, latch 514 may allow passing through of input 1stInE to the OR logic circuit 526.

Also at or around time T0, the output of OR logic circuit 526 provides a high 1stOutFastE signal responsive, at least in part, to the high Latch1OutE signal. At or around time T0, the inverted chip select signal CSOF provided by inverter 512 transitions to low. The CSOF signal may be provided to NOR logic circuit 536.

The mux 532 may provide an inverted 1stOutFastE signal to NOR logic circuit 536. At or around time T1, responsive to the low CSOF signal and the inverted 1stOutFastE signal (which is low because 1stOutFastE is high at T1), the NOR logic circuit 536 may provide a high 2ndInO signal.

At or around time T2, responsive to a rising edge of ClkE, latch 522 may latch signal Latch1OutE and provide a high 1stOutE signal to mux 530. Because 1stOutFastE is provided by OR logic circuit 526, signal 1stOutFastE does not change due to the change in the state of signal 1stOutE.

Responsive to a rising edge of ClkO at or around time T3, the flip-flop 540 may latch the 2ndInO signal and provide a high CmdOutO signal at or around time T4. Although not shown in timing diagram 600, command signals provided to the odd command path 504 and provided to the even command path 502 to mux 530 would follow a similar timing.

Returning to FIG. 4, as indicated by arrow 401 in timing diagram 400, a time from when a command signal 1stInE is provided from the decoder to when CmdOutO is provided is approximately one and a half clock cycles of the ClkE signal. In contrast, as indicated by arrow 601 in timing diagram 600, a time from when a command signal 1stInE is provided from the decoder to when CmdOutO is provided is approximately one clock cycle of the ClkE signal. Accordingly, in some embodiments, the command decoder 500 may provide additional set-up time for commands. Additionally, the 1stOutFastE remains high for approximately one and a half clock cycles of the ClkE signal, compared to 1stOutE, which is high for approximately one clock cycle of the ClkE signal. Accordingly, in some embodiments, the command decoder 500 may provide additional timing margins.

As discussed, some memories may operate in either 2N (only the rising edges of the CLKE or CLKO are used to latch signals) or 1N mode (the rising edges of both CLKE and CLKO are used to latch signals). For example, as shown in FIG. 3, the muxes 326 and 328 provide command signals from the other command path in 1N mode (mode2N signal=0): mux 326 of the even command path 302 provides 1stOutO from the odd command path 304 and mux 328 of the odd command path 304 provides 1stOutE from the even command path 302. However, in 2N mode (mode2N signal=1), the muxes 326 and 328 provide command signals along the same command path: mux 326 provides 1stOutE and mux 328 provides 1stOutO. While multiplexers provide the flexibility to support both 1N mode and 2N mode operation of the memory, multiplexers may cause significant delays. Accordingly, alternative circuitry that provides support for 1N and 2N mode may be desired.

According to embodiments of the present disclosure, a command decoder may provide separate flip-flops for 1N mode and 2N mode operation. In some embodiments, the flip-flops may be tristate flip-flops (e.g., they may be put in a high impedance state). In some embodiments, the command decoder may include alternative logic circuits to reduce or eliminate the need for muxes.

Figure 7:
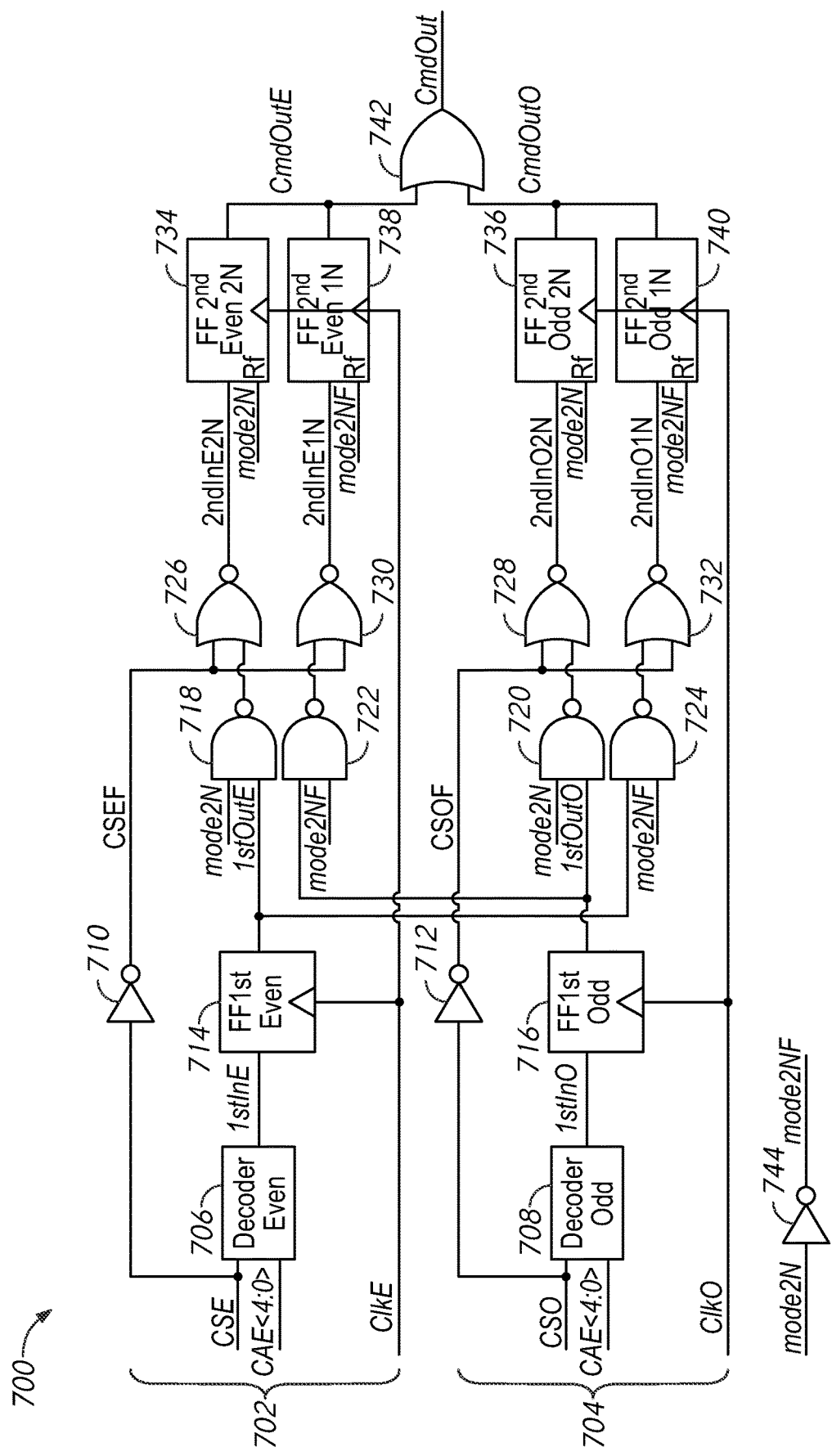
FIG. 7 is a block diagram of a command decoder circuit according to at least one embodiment of the disclosure.

FIG. 7 is a block diagram of a command decoder circuit according to at least one embodiment of the disclosure. In some embodiments, the command decoder 700 may be used to implement or may be included in command decoder 115. The command decoder circuit 700 has two command paths: even 702 and odd 704. The even command path 702 receives internal chip select signal CSE and internal command signals CAE<4:0> from a command address input circuit, such as command address input circuit 105. The even command path 702 further receives command clock signal ClkE from an internal clock signal generator, such as internal clock signal generator 122. The odd command path 704 receives internal chip select signal CSO and internal command signals CAO<4:0> from the command address input circuit. The odd command path 704 further receives command clock signal ClkO from the internal clock signal generator.

A decoder 706 of the even command path 702 receives the command clock CSE and CAE<4:0> signals and provides signal 1stInE to a flip-flop 714. The flip-flop 714 receives the ClkE signal and latches the 1stInE signal responsive to an edge of the ClkE signal. The flip-flop 714 provides signal 1stOutE to an input of a NAND logic circuit 718 of the even command path 702 and an input of a NAND logic circuit 724 of the odd command path 704.

Turning to the odd command path 704, a decoder 708 receives the command clock CSO and CAO<4:0> signals and provides signal 1stInO to a flip-flop 716. The flip-flop 716 receives the ClkO signal and latches the 1stInO signal responsive to an edge of the ClkO signal. The flip-flop 716 provides signal 1stOutO to an input of NAND logic circuit 722 of the even command path 702 and an input of NAND logic circuit 720 of the odd command path 704.

NAND logic circuit 720 further receives a control signal mode2N at an input. In some embodiments, the control signal may be provided by a mode register, such as mode register 130. NAND logic circuit 724 further receives a control signal mode2NF, which is the mode2N signal inverted, as indicated by inverter 744. In some embodiments, the control signal(s) may be provided by a mode register, such as mode register 130. The output of NAND logic circuit 720 may be high unless both 1stOutO and mode2N are both high. The output of NAND logic circuit 724 may be high unless both 1stOutE and mode2NF are both high.

The output of NAND logic circuit 720 may be provided to NOR logic circuit 728. NOR logic circuit 728 also receives an inverted CSO signal (CSOF) from inverter 712. The NOR logic circuit 728 may provide signal 2ndInO2N to flip-flop 736. Signal 2ndInO2N may be high when both the output of NAND logic circuit 720 and CSOF are both low. The output of NAND logic circuit 724 may be provided to NOR logic circuit 732, which may also receive the CSOF signal. The NOR logic circuit 732 may provide signal 2ndInO1N to flip-flop 740. Signal 2ndInO1N may be high when both the output of NAND logic circuit 724 and CSOF are both low.

Flip-flop 736 receives control signal mode2N and clock signal ClkO in addition to the 2ndInO2N signal. The mode2N signal may enable and disable the flip-flop 736. When enabled, flip-flop 736 may latch the 2ndInO2N responsive to an edge of the ClkO signal and provide the command signal CmdOutO to OR logic circuit 742. When disabled, flip-flop 736 may be in a high impedance state.

Flip-flop 740 receives control signal mode2NF and clock signal ClkO in addition to the 2ndInO1N signal. The mode2NF signal may enable and disable the flip-flop 740. When enabled, flip-flop 740 may latch the 2ndInO1N responsive to an edge of the ClkO signal and provide the command signal CmdOutO to OR logic circuit 742. When disabled, flip-flop 740 may be in a high impedance state.

Returning to the even command path 702, NAND logic circuit 718 receives signal 1stOutE and the control signal mode2N at an input. NAND logic circuit 722 receives signal 1stOutO and the control signal mode2NF. The output of NAND logic circuit 718 may be high unless both 1stOuE and mode2N are both high. The output of NAND logic circuit 722 may be high unless both 1stOutO and mode2NF are both high.

The output of NAND logic circuit 718 may be provided to NOR logic circuit 726. NOR logic circuit 726 also receives an inverted CSE signal (CSEF) from inverter 710. The NOR logic circuit 726 may provide signal 2ndInE2N to flip-flop 734. Signal 2ndInE2N may be high when both the output of NAND logic circuit 728 and CSEF are both low. The output of NAND logic circuit 722 may be provided to NOR logic circuit 730, which may also receive the CSEF signal. The NOR logic circuit 730 may provide signal 2ndInE1N to flip-flop 738. Signal 2ndInE1N may be high when both the output of NAND logic circuit 722 and CSEF are both low.

Flip-flop 734 receives control signal mode2N and clock signal ClkE in addition to the 2ndInE2N signal. The mode2N signal may enable and disable the flip-flop 734. When enabled, flip-flop 734 may latch the 2ndInE2N responsive to an edge of the ClkE signal and provide the command signal CmdOutE to OR logic circuit 742. When disabled, flip-flop 734 may be in a high impedance state.

Flip-flop 738 receives control signal mode2NF and clock signal ClkE in addition to the 2ndInE1N signal. The mode2NF signal may enable and disable the flip-flop 738. When enabled, flip-flop 738 may latch the 2ndInE1N responsive to an edge of the ClkE signal and provide the command signal CmdOutE to OR logic circuit 742. When disabled, flip-flop 738 may be in a high impedance state.

Flip-flops 734 and 736 may be enabled when a memory including command decoder 700 is operating in 2N mode and disabled when the memory is operating in 1N mode. Flip-flops 738 and 740 may be enabled when the memory is operating in 1N mode and disabled when the memory is operating in 2N mode. The OR logic circuit 742 may provide an internal command signal CmdOut responsive to the CmdOutE and CmdOutO signals provided by the enabled flip-flops. Thus, in 2N mode, CmdOut is based on the output of flip-flops 734 and 736 and in 1N mode, CmdOut is based on the outputs of flip-flops 738 and 740.

In some embodiments, the NAND logic circuits 718, 722, 720, and 724 may have a shorter propagation delay than muxes, such as muxes 326 and 328. Further, because flip-flops 734, 738, 736, and 740 may be placed in a high impedance state, in some embodiments, selective logic for their outputs may be omitted. In some embodiments, the shorter propagation delays may be achieved without an increase in operating current.

Figure 8:
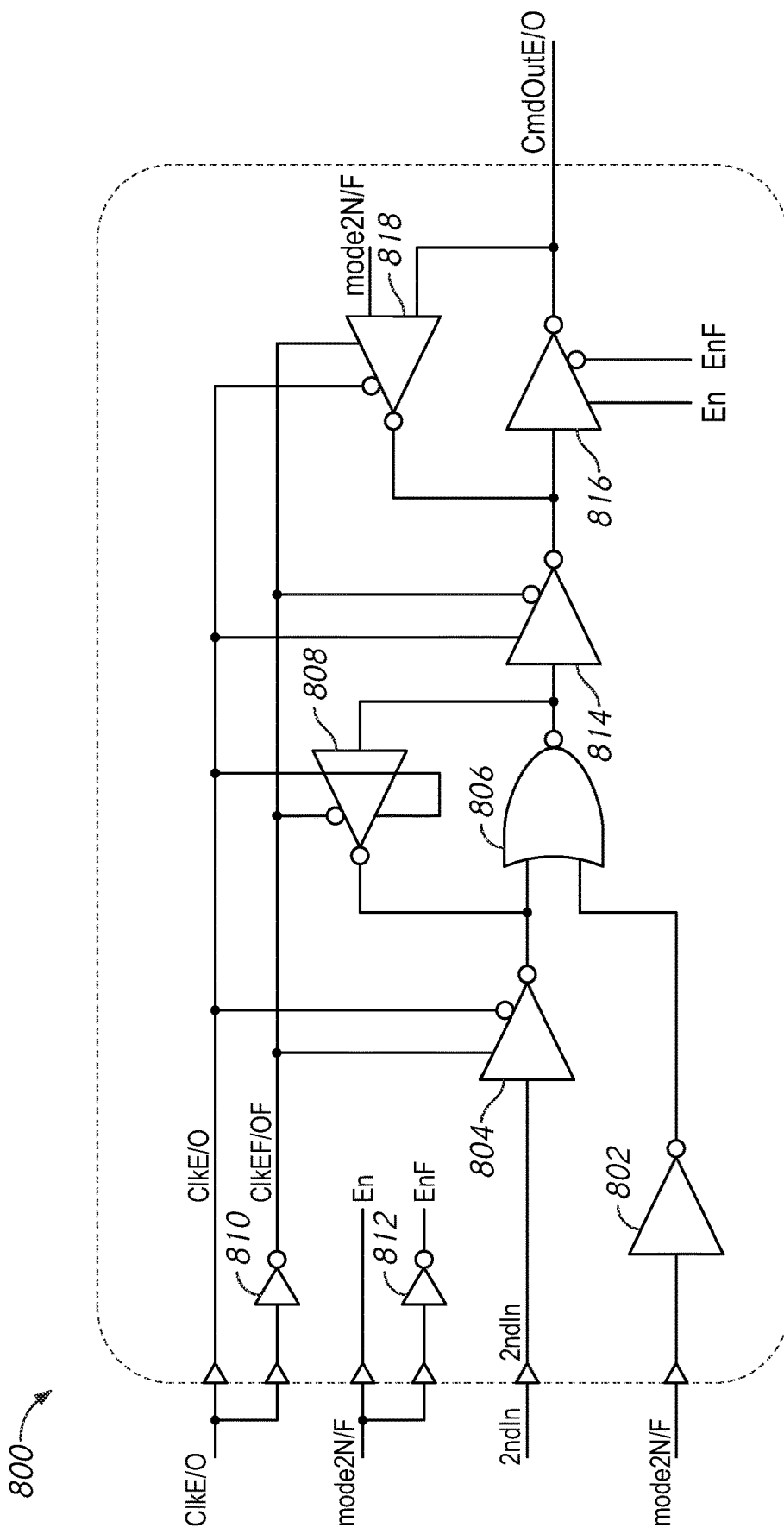
FIG. 8 is a circuit diagram of a flip-flop of a command decoder circuit according to at least one embodiment of the disclosure.

FIG. 8 is a circuit diagram of a flip-flop of a command decoder circuit according to at least one embodiment of the disclosure. Flip-flop 800 may be used to implement flip-flop 734, 736, 738, and/or 740 in some embodiments.

Flip-flop 800 receives a clock signal ClkE/O, a control signal mode2N/F, and a command signal 2ndIn. Based, at least in part, on these inputs, flip-flop 800 provides an output command signal CmdOutE/O. When flip-flop 800 is used to implement flip-flop 734, ClkE/O corresponds to ClkE, mode2N/F corresponds to mode2N, and 2ndIn corresponds to 2ndInE2N, and CmdOutE/O corresponds to CmdOutE. When flip-flop 800 is used to implement flip-flop 736, ClkE/O corresponds to ClkO, mode2N/F corresponds to mode2N, 2ndIn corresponds to 2ndInO2N, and CmdOutE/O corresponds to CmdOutO. When flip-flop 800 is used to implement flip-flop 738, ClkE/O corresponds to ClkE, mode2N/F corresponds to mode2NF, 2ndIn corresponds to 2ndInE1N, and CmdOutE/O corresponds to CmdOutE. When flip-flop 800 is used to implement flip-flop 740, ClkE/O corresponds to ClkO, mode2N/F corresponds to mode2NF, 2ndIn corresponds to 2ndInO1N, and CmdOutE/O corresponds to CmdOutO.

The flip-flop 800 includes an inverter 802 that receives the mode2N/F signal and an inverter 804 that receives the 2ndIn signal. The outputs of inverters 802 and 804 are provided to a NOR logic circuit 806. The NOR logic circuit 806 provides an output to inverter 814 and inverter 808. The output of the inverter 808 is provided to a same input of the NOR logic circuit 806 as the output of inverter 804.

The output of inverter 814 is provided to an inverter 816. The output of inverter 816 provides the CmdOutE/O signal from the flip-flop 800. The output of inverter 816 is further provided to inverter 818. Inverter 818 further receives the mode2N/F control signal, and the output of inverter 818 is provided to the input of inverter 816.

In some embodiments, such as the one shown in FIG. 8, inverters 804, 808, 814 and 818 are clocked inverters that receive complementary clock signals ClkE/O and ClkEF/OF. The ClkE/O signal is provided at an input of the flip-flop 800 and to the input of an inverter 810. The output of inverter 810 may provide the complementary ClkEF/OF signal to inverters 804, 808, 814 and 818.

Returning to inverter 816, rather than being a clocked inverter, inverter 816 may be a tristate inverter. That is, inverter 816 may have three possible states: logic high, logic low, and a high impedance state. Inverter 816 may receive enable signals En and EnF. The enable signal En may correspond to the mode2N/F signal provided at the enable input of the flip-flop 800. The mode2N/F signal may be provided to an input of inverter 812 and the output of inverter 812 may provide the inverted En signal-EnF.

When inverter 816 is enabled, inverter 816 may provide a high or a low logic level based, at least in part, on the state of the signal provided at the input of inverter 816. When inverter 816 is disabled, it may provide a high impedance output, regardless of the input. When flip-flop 800 is used to implement flip-flop 734 and/or 736, inverter 816 may be enabled when the mode2N signal is high and disabled when the mode2N signal is low. When flip-flop 800 is used to implement flip-flop 738 or 740, inverter 816 may be enabled when the mode2NF signal is high and disabled when the mode2NF signal is low.

By providing the tristate inverter 816 at the final stage of flip-flop 800, selective logic for the output of flip-flop 800 may be omitted. For example, no logic is required to select between the outputs of flip-flops 734 and 738 to provide CmdOutE. In another example, no logic is required to select between the outputs of flip-flops 736 and 740 to provide CmdOutO. In some embodiments, using the tristate inverter 816 may not increase the current requirements of the flip-flop 800.

Command decoders according to the embodiments disclosed herein may provide reduced propagation delays and/or provide additional command set-up time compared to existing command decoders. For example, command decoder 500 many provide command data (e.g., 1stOutFastE, 1stOutFastO signals) from one command path to another command path sooner compared to existing command decoders. In another example, the command decoder 700 includes separate flip-flops for different command modes (e.g., 1N and 2N mode). The flip-flops may be able to be put into a high impedance state. The command decoder 700 also includes alternative logic, such as NAND logic circuits, instead of multiplexers. While the features of command decoder 500 and command decoder 700 may be utilized separately, the features of command decoder 500 and command decoder 700 may also be combined.

Figure 9:
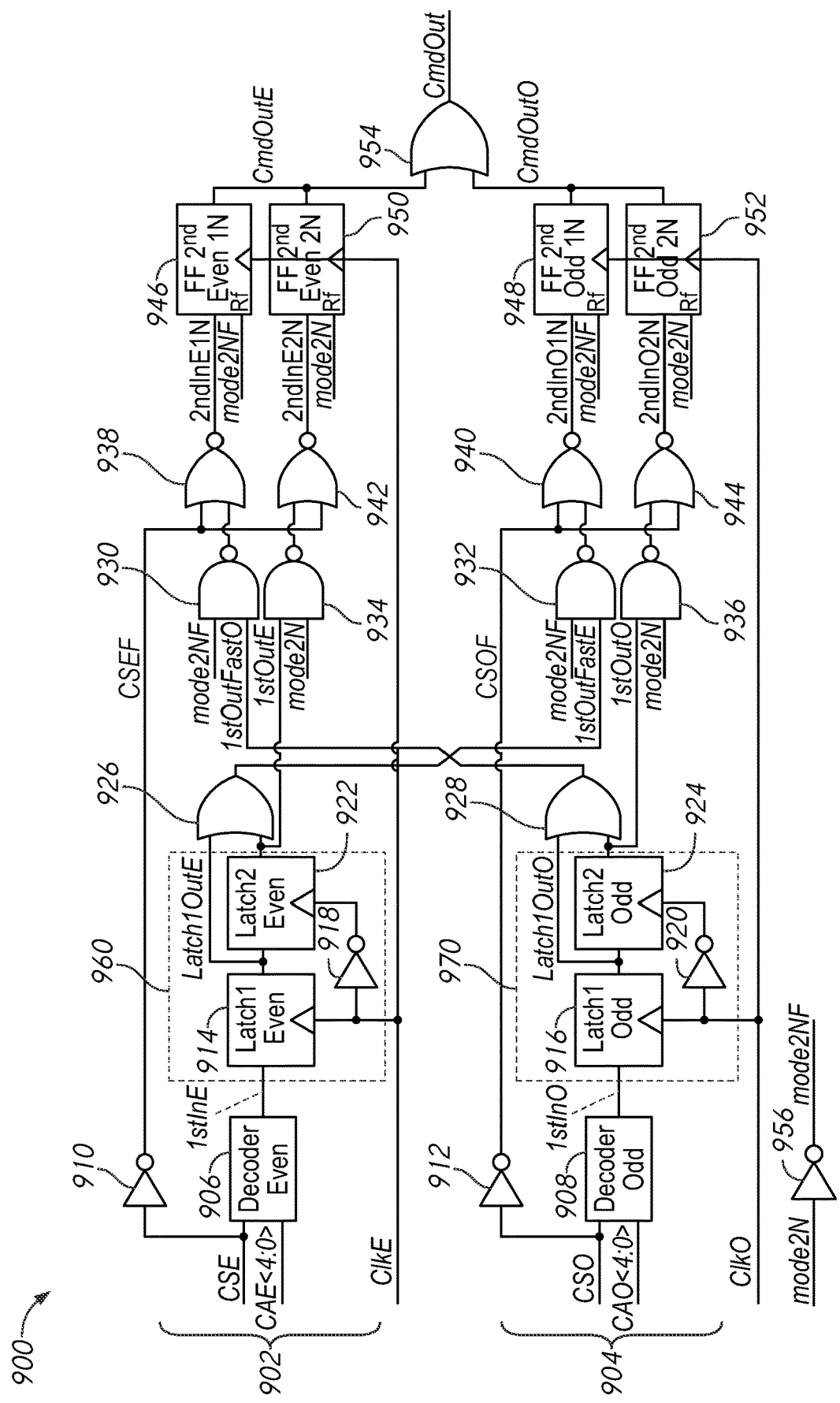
FIG. 9 is a block diagram of a command decoder circuit according to at least one embodiment of the disclosure.

FIG. 9 is a block diagram of a command decoder circuit according to at least one embodiment of the disclosure. Command decoder 900 may be used to implement or be included in command decoder 115 in some embodiments.

The command decoder circuit 900 has two command paths: even 902 and odd 904. The even command path 902 receives internal chip select signal CSE and internal command signals CAE<4:0> from a command address input circuit, such as command address input circuit 105. The even command path 902 further receives command clock signal ClkE from an internal clock signal generator, such as internal clock signal generator 122. The odd command path 904 receives internal chip select signal CSO and internal command signals CAO<4:0> from the command address input circuit. The odd command path 904 further receives command clock signal ClkO from the internal clock signal generator.

A decoder 906 of the even command path 902 receives the command clock CSE and CAE<4:0> signals and provides signal 1stInE to a flip-flop 960. The flip-flop 960 may include a latch 914 that receives the ClkE signal, an inverter 918 that receives the ClkE signal, and a latch 922 that receives the output of the latch 914 and an inverted ClkE signal from the inverter 918. The flip-flop 960 latches the 1stInE signal with latch 914 responsive to an edge of the ClkE signal and latch 922 may latch the output of latch 914 responsive to a different edge of the ClkE signal due to receiving the inverted ClkE signal from inverter 918.

Flip-flop 960 provides two outputs: signal Latch1OutE provided by latch 914 and signal 1stOutE provided by latch 922. Signals Latch1OutE and 1stOutE may be provided to an OR logic circuit 926. The OR logic circuit 926 may provide a signal 1stOutFastE to an input of NAND logic circuit 932 of the odd command path 904. The signal 1stOutE may further be provided to an input of NAND logic circuit 934 of the even command path 502.

Turning to the odd command path 904, a decoder 908 receives the command clock CSO and CAO<4:0> signals and provides signal 1stInO to a flip-flop 970. The flip-flop 970 may include a latch 916 that receives the ClkO signal, an inverter 920 that receives the ClkO signal, and a latch 924 that receives the output of the latch 916 and an inverted ClkO signal from the inverter 920. The flip-flop 970 latches the 1stInO signal with latch 916 responsive to an edge of the ClkO signal and latch 924 may latch the output of latch 916 responsive to a different edge of the ClkO signal due to receiving the inverted ClkO signal from inverter 920.

Flip-flop 970 provides two outputs: signal Latch1OutO provided by latch 916 and signal 1stOutO provided by latch 924. Signals Latch1OutO and 1stOutO may be provided to an OR logic circuit 928. The OR logic circuit 928 may provide a signal 1stOutFastO to an input of NAND logic circuit 930 of the even command path 902. The signal 1stOutO may further be provided to an input of NAND logic circuit 936 of the odd command path 904.

NAND logic circuit 936 further receives a control signal mode2N at an input. In some embodiments, the control signal may be provided by a mode register, such as mode register 130. NAND logic circuit 932 further receives a control signal mode2NF, which is the mode2N signal inverted, as indicated by inverter 956. In some embodiments, the control signal(s) may be provided by a mode register, such as mode register 130. The output of NAND logic circuit 936 may be high unless both 1stOutO and mode2N are both high. The output of NAND logic circuit 932 may be high unless both 1stOutFastE and mode2NF are both high.

The output of NAND logic circuit 936 may be provided to NOR logic circuit 944. NOR logic circuit 944 also receives an inverted CSO signal (CSOF) from inverter 912. The NOR logic circuit 944 may provide signal 2ndInO2N to flip-flop 952. Signal 2ndInO2N may be high when both the output of NAND logic circuit 936 and CSOF are both low. The output of NAND logic circuit 932 may be provided to NOR logic circuit 940, which may also receive the CSOF signal. The NOR logic circuit 940 may provide signal 2ndInO1N to flip-flop 948. Signal 2ndInO1N may be high when both the output of NAND logic circuit 940 and CSOF are both low.

Flip-flop 952 receives control signal mode2N and clock signal ClkO in addition to the 2ndInO2N signal. The mode2N signal may enable and disable the flip-flop 952. When enabled, flip-flop 952 may latch the 2ndInO2N responsive to an edge of the ClkO signal and provide the command signal CmdOutO to OR logic circuit 954. When disabled, flip-flop 952 may be in a high impedance state.

Flip-flop 948 receives control signal mode2NF and clock signal ClkO in addition to the 2ndInO1N signal. The mode2NF signal may enable and disable the flip-flop 948. When enabled, flip-flop 948 may latch the 2ndInO1N responsive to an edge of the ClkO signal and provide the command signal CmdOutO to OR logic circuit 954. When disabled, flip-flop 948 may be in a high impedance state.

Returning to the even command path 902, NAND logic circuit 934 receives signal 1stOutE and the control signal mode2N at an input. NAND logic circuit 930 receives signal 1stOutFastO and the control signal mode2NF. The output of NAND logic circuit 934 may be high unless both 1stOutE and mode2N are both high. The output of NAND logic circuit 930 may be high unless both 1stOutO and mode2NF are both high.

The output of NAND logic circuit 934 may be provided to NOR logic circuit 942. NOR logic circuit 942 also receives an inverted CSE signal (CSEF) from inverter 910. The NOR logic circuit 942 may provide signal 2ndInE2N to flip-flop 950. Signal 2ndInE2N may be high when both the output of NAND logic circuit 934 and CSEF are both low. The output of NAND logic circuit 930 may be provided to NOR logic circuit 938, which may also receive the CSEF signal. The NOR logic circuit 938 may provide signal 2ndInE1N to flip-flop 946. Signal 2ndInE1N may be high when both the output of NAND logic circuit 930 and CSEF are both low.

Flip-flop 950 receives control signal mode2N and clock signal ClkE in addition to the 2ndInE2N signal. The mode2N signal may enable and disable the flip-flop 950. When enabled, flip-flop 950 may latch the 2ndInE2N responsive to an edge of the ClkE signal and provide the command signal CmdOutE to OR logic circuit 954. When disabled, flip-flop 950 may be in a high impedance state.

Flip-flop 946 receives control signal mode2NF and clock signal ClkE in addition to the 2ndInE1N signal. The mode2NF signal may enable and disable the flip-flop 946. When enabled, flip-flop 946 may latch the 2ndInE1N responsive to an edge of the ClkE signal and provide the command signal CmdOutE to OR logic circuit 954. When disabled, flip-flop 946 may be in a high impedance state.

Flip-flops 950 and 952 may be enabled when a memory including command decoder 900 is operating in 2N mode and disabled when the memory is operating in 1N mode. Flip-flops 946 and 948 may be enabled when the memory is operating in 1N mode and disabled when the memory is operating in 2N mode. The OR logic circuit 954 may provide an internal command signal CmdOut responsive to the CmdOutE and CmdOutO signals provided by the enabled flip-flops. Thus, in 2N mode, CmdOut is based on the output of flip-flops 950 and 952 and in 1N mode, CmdOut is based on the outputs of flip-flops 946 and 950. In some embodiments, flip-flop 946, 950, 948, and/or 952 may be implemented by flip-flop 800.

The command decoder 900 may provide the signal from the decoder of one command path to another command path (e.g., from even to odd or odd to even) sooner than current command decoders, similar to command decoder 500. The command decoder 900 may provide fewer propagation delays compared to current command decoders that utilize multiplexers, similar to command decoder 700. Accordingly, as shown in FIG. 9, the features of command decoder 500 and command decoder 700 may be utilized together and may provide the benefits of both in a single command decoder, such as command decoder 900.

Figure 10:
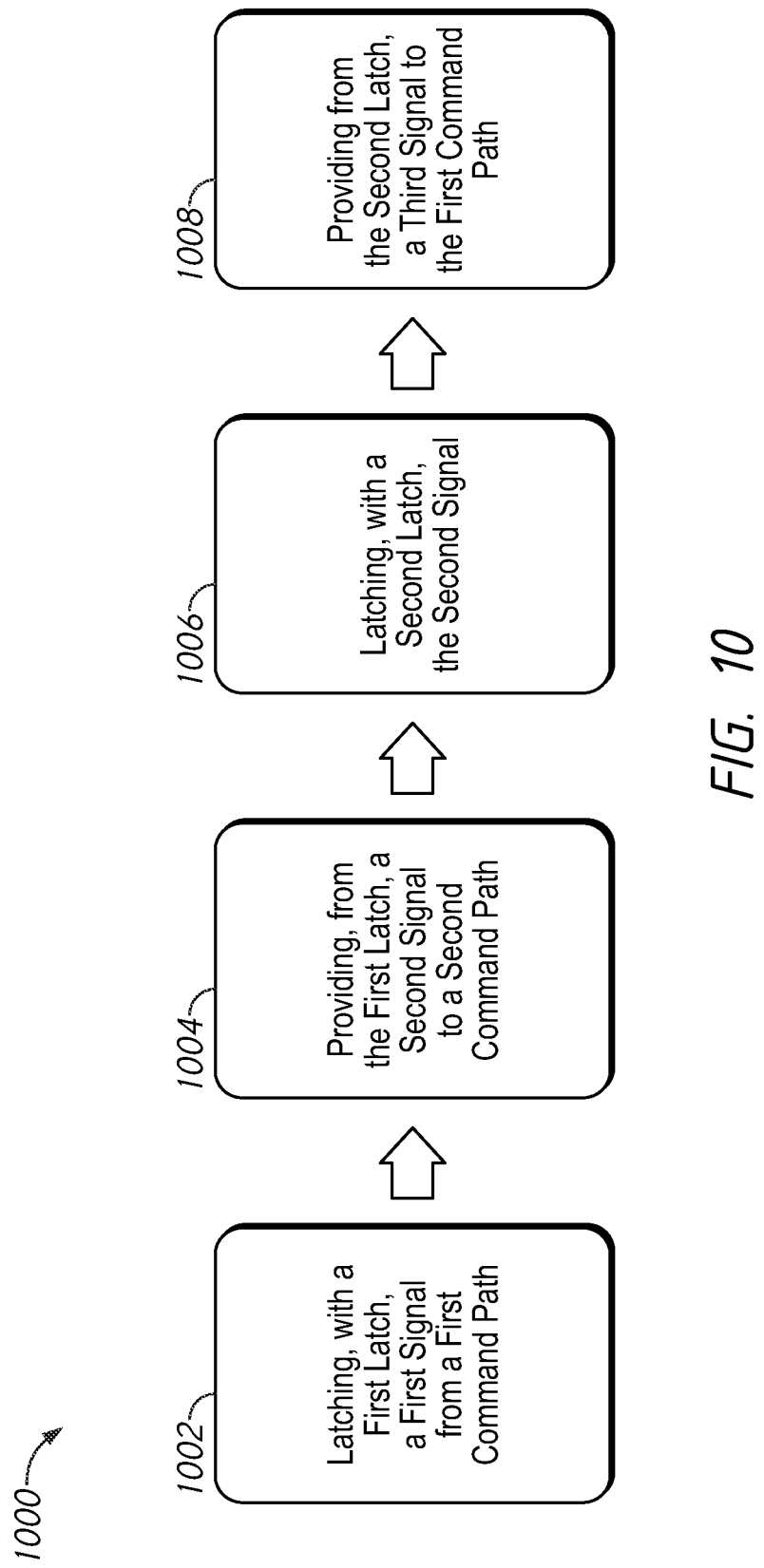
FIG. 10 is a flow chart of a method according to at least one embodiment of the disclosure.

FIG. 10 is a flow chart of a method according to at least one embodiment of the disclosure. In some embodiments, the method 1000 may be performed in whole or in part by a command decoder, such as command decoder 115, 500, and/or 900.

At block 1002, "latching, with a first latch, a first signal from a first command path" may be performed. In some embodiments, the first latch may be implemented by latch 514, 516, 914, and/or 916.

At block 1004, "providing, from the first latch, a second signal to a second command path" may be performed. In some embodiments, second signal may include and/or be based on signal Latch1OutE, Latch1OutO, 1stOutFastE, and/or 1stOutFastO.

At block 1006, "latching, with a second latch, the second signal" may be performed. In some embodiments, the second latch may be implemented by latch 522, 524, 922, and/or 924.

At block 1008, "providing from the second latch, a third signal to the first command path" may be performed. In some embodiments, the third signal may include and/or be based on signal 1stOutE and/or 1stOutO.

Optionally, in some embodiments, method 1000 may further include latching, with a third latch, a fourth signal from the second command path, providing, from the third latch, a fifth signal to the first command path, latching, with a fourth latch, the fifth signal, and providing from the fourth latch, a sixth signal to the second command path. In some embodiments, the latching of the first and second latches may be responsive to a first command clock signal and the latching of the third and fourth latches is responsive to a second command clock signal complementary to the first command clock signal.

Figure 11:
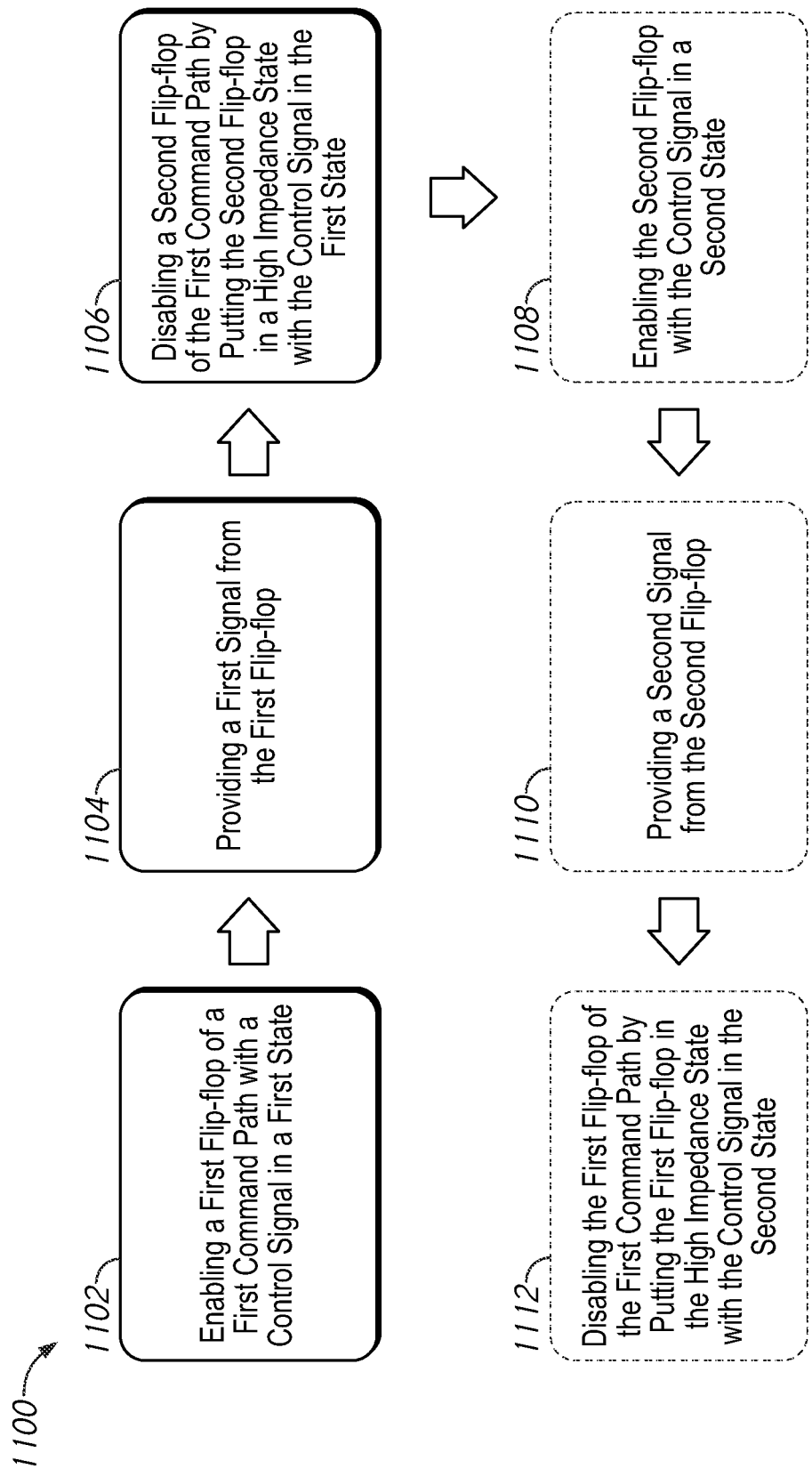
FIG. 11 is a flow chart of a method according to at least one embodiment of the disclosure.

FIG. 11 is a flow chart of a method according to at least one embodiment of the disclosure. In some embodiments, the method 1100 may be performed in whole or in part by a command decoder, such as command decoder 115, 700, and/or 900.

At block 1102, "enabling a first flip-flop of a first command path with a control signal in a first state" may be performed. In some embodiments, the first flip-flop may be implemented by flip-flop 734, 736, 950, and/or 952.

At block 1104, "providing a first signal from the first flip-flop" may be performed. In some embodiments, the first signal may include and/or be based on signal CmdOutE and/or CmdOutO.

At block 1106, "disabling a second flip-flop of the first command path by putting the second flip-flop in a high impedance state with the control signal in the first state." In some embodiments, the second flip-flop may be implemented by flip-flop 738, 740, 946, and/or 948.

Optionally at block 1108, "enabling the second flip-flop with the control signal in a second state" may be performed.

Optionally, at block 1110, "providing a second signal from the second flip-flop" may be performed. In some embodiments, the second signal may include and/or be based on signal CmdOutE and/or CmdOutO. In some embodiments, the second signal is based, at least in part, on signal provided from a second command path.

Optionally, at block 1112, "disabling the first flip-flop of the first command path by putting the first flip-flop in the high impedance state with the control signal in the second state" may be performed.

In some embodiments, the control signal may be provided by a mode register, such as mode register 130. In some embodiments, the control signal may indicate whether a memory including the flip-flops is operating in a first mode or a second mode, such as 1N mode and 2N mode.

Although the examples provided herein describe command decoders with two command paths, the features of the present disclosure may be applied to command decoders with more command paths (e.g., four, six, eight). Further, although the use of certain logic circuits are shown (e.g., NAND, OR, NOR, etc.), in other examples, different logic circuits providing equivalent outputs may be used in other examples.

Certain details are set forth herein to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

What is claimed is:

1. An apparatus, comprising:
   a first command path comprising a first flip-flop, wherein the first flip-flop includes a first latch coupled to a second latch; and
   a second command path comprising a second flip-flop, wherein the second flip-flop includes a third latch coupled to a fourth latch,
   wherein the first latch is configured to provide a first signal to the second latch and the second command path, and
   wherein the third latch is configured to provide a second signal to the fourth latch and the first command path.

2. The apparatus of claim 1, wherein the second latch is configured to provide a third signal to the second command path and the fourth latch is configured to provide a fourth signal to the first command path.

3. The apparatus of claim 2, further comprising:
   a first logic circuit configured to receive the first signal and the third signal and provide the first and third signals to the second command path; and
   a second logic circuit configured to receive the second signal and the fourth signal and provide the second and fourth signals to the first command path.

4. The apparatus of claim 3, wherein at least one of the first logic circuit and the second logic circuit comprises an OR logic circuit.

5. The apparatus of claim 1, wherein the second latch is configured to provide a third signal to a first multiplexer of the first command path and the fourth latch is configured to provide a fourth signal to a second multiplexer of the second command path.

6. The apparatus of claim 5, wherein the first multiplexer further receives the second signal and the second multiplexer further receives the first signal.

7. The apparatus of claim 6, wherein the first multiplexer and the second multiplexer receive a control signal indicating an operation mode of a memory, wherein the first multiplexer provides the second signal and the second multiplexer provides the first signal when the control signal is in a first state and the first multiplexer provides the third signal and the second multiplexer provides the fourth signal when the control signal is in a second state.

8. The apparatus of claim 7, further comprising a mode register configured to provide the control signal.

9. An apparatus comprising:
   a first command path configured to receive a first command clock signal, the first command path comprising:
      a first latch configured to latch a first signal based on a first edge of the first command clock signal; and
      a second latch configured to latch a second signal from the first latch based on a second edge of the first command clock signal, wherein the first latch is configured to provide the second signal to a second command path, wherein the second command path is configured to receive a second command clock signal, and the second command path comprises:
      a third latch configured to latch a third signal based on a fourth edge of the second command clock signal; and
      a fourth latch configured to latch a fourth signal from the third latch based on a fifth edge of the second command clock signal,
   wherein the third latch is configured to provide the fourth signal to the first command path.

10. The apparatus of claim 9, wherein the first command clock signal and the second command clock signal are complementary.

11. The apparatus of claim 9, wherein the first command path comprises a first decoder configured to provide the first signal and the second command path comprises a second decoder configured to provide the third signal.

12. The apparatus of claim 9, wherein the first decoder provides the first signal based, at least in part, on a first command signal and a first chip select signal and the second decoder provides the third signal based, at least in part, on a second command signal and a second chip select signal.

13. The apparatus of claim 9, wherein the first command path and the second command path are configured to receive a control signal,
   wherein the first command path is configured to provide a first command signal based, at least in part on the fourth signal, and the second command path is configured to provide a second command signal based, at least in part on the second signal, when the control signal is in a first state, and
   wherein the first command path is configured to provide the first command signal based, at least in part on the second signal, and the second command path is configured to provide the second command signal based, at least in part on the fourth signal, when the control signal is in a second state.

14. The apparatus of claim 9, further comprising a logic circuit configured to receive a first command signal from the first command path and a second command signal from the second command path and provide a third command signal based, at least in part, on the first command signal and the second command signal.

15. The apparatus of claim 9, wherein the first edge is a rising edge of the first command clock signal and the second edge is a falling edge of the first command clock signal, or the first edge is the falling edge of the first command clock signal and the second edge is the rising edge of the first command clock signal.

16. The apparatus of claim 9, further comprising an inverter configured to receive the first command clock signal and provide an inverted first command clock signal to the second latch.

17. An apparatus, comprising:
a first command path including a first flip-flop which comprises a first latch and a second latch coupled to an output node of the first latch;
a second command path including a second flip-flop which comprises a third latch and a fourth latch coupled to an output node of the third latch;
an output circuit, to which the first command path and the second command path are coupled in parallel, configured to output a signal transferred by at least one of the first command path and the second command path; and
a cross-coupled path configured, in a first operation mode, to transfer a first signal at the output node of the first latch to the second command path and transfer a second signal at the output node of the third latch to the first command path.

18. The apparatus of claim 17, wherein the cross-coupled path configured, in a second operation mode, to keep the first signal driving in the first command path and keep the second signal driving in the second command path.

19. The apparatus of claim 17, wherein the first command path is configured to receive command signals captured responsively to an even clock cycle of a clock signal and wherein the second command path is configured to receive command signals captured responsively to an odd clock cycle of the clock signal.

20. The apparatus of claim 19, wherein the first flip-flop is configured to receive a first command clock signal generated based on the clock signal, wherein the second flip-flop is configured to receive a second command clock signal generated based on the clock signal and wherein phases of the first command clock signal and the second command clock signals are shifted from each other.

* * * * *